(12) United States Patent
Maeda et al.

(10) Patent No.: US 8,163,652 B2
(45) Date of Patent: Apr. 24, 2012

(54) PLASMA PROCESSING METHOD AND PLASMA PROCESSING DEVICE

(75) Inventors: Kenji Maeda, Kudamatsu (JP);
Tomoyuki Tamura, Kudamatsu (JP);
Hiroyuki Kobayashi, Kodaira (JP);
Kenetsu Yokogawa, Tsurugashima (JP);
Tadamitsu Kanekiyo, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 752 days.

(21) Appl. No.: 12/199,028

(22) Filed: Aug. 27, 2008

(65) Prior Publication Data

US 2009/0004871 A1 Jan. 1, 2009

Related U.S. Application Data

(63) Continuation of application No. 11/336,872, filed on Jan. 23, 2006, now Pat. No. 7,435,687.

(30) Foreign Application Priority Data

Sep. 15, 2005 (JP) .................................. 2005-268175

(51) Int. Cl.
*H01L 21/302* (2006.01)
(52) U.S. Cl. .......... 438/714; 438/689; 438/702; 216/67; 216/71; 156/345.48
(58) Field of Classification Search .................. 438/689, 438/702, 714; 216/67, 71; 156/345.48; 427/532–535; 134/1.1–1.3
See application file for complete search history.

(56) References Cited

U.S. PATENT DOCUMENTS

| 6,062,163 | A | * | 5/2000 | Patrick et al. | ............... 118/723 I |
| 6,156,152 | A | * | 12/2000 | Ogino et al. | ............. 156/345.42 |
| 6,576,559 | B2 | | 6/2003 | Nakata | |
| 6,676,800 | B1 | * | 1/2004 | Festa et al. | ................ 156/345.1 |
| 6,777,037 | B2 | | 8/2004 | Sumiya | |
| 2001/0027843 | A1 | | 10/2001 | Komino | |
| 2004/0026372 | A1 | | 2/2004 | Takenaka | |

(Continued)

FOREIGN PATENT DOCUMENTS

JP 05-047712 2/1993

(Continued)

OTHER PUBLICATIONS

H.H. Hwang, Appl. Phys. Lett 68, p. 3716, 1996.

(Continued)

*Primary Examiner* — Nadine G Norton
*Assistant Examiner* — Maki Angadi
(74) *Attorney, Agent, or Firm* — Antonelli, Terry, Stout & Kraus, LLP.

(57) ABSTRACT

A plasma processing method using plasma includes steps of applying current to a coil and introducing gas into a processing chamber, applying a bias power that does not generate plasma, applying a source power to generate plasma so that a plasma density distribution is high above an outer circumference of a semiconductor wafer and low above a center of the semiconductor wafer, and forming a shape of a sheath layer having a positive ion space charge directly above the semiconductor wafer so as to be convex in an upper direction from the semiconductor wafer, thereby eliminating foreign particles trapped in a boundary of the sheath layer having a positive ion space charge directly above the semiconductor wafer, generating plasma for processing the semiconductor wafer under a condition different from the conditions of the previous steps.

12 Claims, 12 Drawing Sheets

U.S. PATENT DOCUMENTS

| | | |
|---|---|---|
| 2004/0050495 A1 | 3/2004 | Sumiya |
| 2006/0191555 A1 | 8/2006 | Yoshida |
| 2007/0251920 A1* | 11/2007 | Hoffman .................. 216/67 |

FOREIGN PATENT DOCUMENTS

| | | |
|---|---|---|
| JP | 09-237698 | 9/1997 |
| JP | 10-144668 | 5/1998 |
| JP | 11-162946 | 6/1999 |
| JP | 2000-277294 | 10/2000 |
| JP | 2001-156051 | 6/2001 |
| JP | 2002-009060 | 1/2002 |
| JP | 2004-200307 | 7/2004 |
| JP | 2005-142436 | 6/2005 |

OTHER PUBLICATIONS

Journal of Applied Physics 97, 043306, 2005.
Clean Technology, Jan. 2004, p. 5-12.

* cited by examiner

DURING WAFER PROCESSING

DURING ON / OFF OF PLASMA

PLASMA PROCESSING METHOD AND PLASMA PROCESSING DEVICE

CROSS REFERENCE TO RELATED APPLICATION

This application is a continuation application of U.S. application Ser. No. 11/336,872, filed Jan. 23, 2006, now U.S. Pat. No. 7,435,687, the contents of which are incorporated herein by reference.

The present application is based on and claims priority of Japanese patent application No. 2005-268175 filed on Sep. 15, 2005, the entire contents of which are hereby incorporated by reference.

BACKGROUND OF THE INVENTION

1. Field of the Invention

The present invention relates to a plasma processing method and plasma processing device preferable for carrying out processes using plasma such as etching to materials such as silicon oxide, silicon nitride, low dielectric constant film (low-k film), polysilicon and aluminum in a process for manufacturing semiconductor devices.

2. Description of the Related Art

In the manufacture of semiconductor devices, plasma processing devices are widely used to carry out processes such as film deposition and etching. Such plasma processing devices are required to realize a highly accurate processing performance and mass-productivity in correspondence to finer processing of devices. Now, a large problem in mass production is the deterioration of yield caused by foreign particles adhering to the wafer during plasma processing.

Foreign particles adhering to the wafer during plasma processing may cause crucial defects of the device such as disconnection of wires or short circuit. Moreover, as the device becomes more miniaturized, even the very minute foreign particles which had not been an issue in the past may have a greater influence. Though it is possible to remove the foreign particles through wet processing after the plasma processing, it is not desirable since the increased processes raise the manufacturing costs of the devices. Thus, particular attention is paid in carrying out plasma processes to reduce the amount of foreign particles being generated, to eliminate the generated particles and to prevent the particles from falling on the wafer.

Japanese Patent Application Laid-Open Publication No. 11-162946 (patent document 1) discloses an example of an art for eliminating foreign particles during plasma processing. The publication of patent document 1 discloses generating lines of magnetic force B that are diverged upwards, and having foreign particles move out of range of the area above the semiconductor wafer along the lines of magnetic force B.

Japanese Patent Application Laid-Open Publication No. 5-47712 (patent document 2) discloses another example of an art for eliminating foreign particles during plasma processing. Patent document 2 discloses reducing the amount of foreign particles by providing a second plasma generating electrode on the circumference of a lower electrode, and applying a high frequency voltage to the second plasma generating electrode immediately before suspending the plasma discharge in order to produce a high density sub-plasma on the circumference of the lower electrode and forming the distribution of sub-potential in a processing chamber to push out the foreign particles which are negatively charged and held up in the vicinity of the main surface of a semiconductor wafer.

Further, it has been known widely that the foreign particles in the plasma fall on the wafer not when the plasma processing is carried out but when the plasma is turned on and off. For example, "H. H. Hwang, Appl. Phys. Lett. 68, p. 3716, 1996" (non-patent document 1) discloses that during plasma processing, that is, during the time in which RF bias is applied to a wafer, the foreign particles are trapped in the boundary between a sheath formed directly above the wafer and bulk plasma, so that they are prevented from falling on the wafer. On the other hand, "Journal of Applied Physics 97, 043306, 2005" (non-patent document 2) discloses an expression related to the sheath thickness ds of the RF sheath formed directly above the wafer when RF bias is applied to the wafer in plasma. Further, "Clean technology, January 2004, p. 9" (non-patent document 3) refers to a force Fg applied to a static foreign particle from the gas flow surrounding the particle.

The art disclosed in patent document 1 utilizes the fact that foreign particles in the plasma are electrically charged. In general, when foreign particles enter the bulk plasma, the particles are negatively charged since the diffusion coefficient of electrons is much greater than the diffusion coefficient of positive ions.

As known, the charges in motion in a magnetic field are subjected to Lorentz force from the magnetic field and move in such a manner as to coil around the magnetic field, so the direction of movement of the charges are bound by the magnetic lines of force. If the mass is small as in the case of electrons (or more accurately, if the specific charge e/m is large, wherein e represents quantity of electric charge and m represents mass) the motion thereof can be sufficiently bound by the magnetic field of a few Gauss to a few hundred Gauss used in plasma processing devices. However, if the mass is close to that of ions (which is a few thousand times greater than that of electrons), it is impossible to bound the action thereof by a magnetic field of a few Gauss to a few hundred Gauss.

For example, if a magnetic field of 75 Gauss is applied to a plasma used generally for plasma processing, the Larmor radius of electrons is 1 mm or smaller, whereas the Larmor radius of ions is approximately 20 to 30 mm, which is one digit greater than the mean free path of gases (which is approximately a few mm). This means that electrons are capable of revolving for a few times around the lines of magnetic force before colliding against gas molecules, or in other words, the motion of electrons can be bound by magnetic fields, whereas ions collide against gas molecules before revolving around the lines of magnetic force and the direction of motion thereof is changed, or in other words, the motion of ions cannot be bound by magnetic fields. Further, even a particle having a diameter as small as 0.1 μm has a mass greater by approximately 8 digits than that of ions, it is impossible to bound the motion thereof by magnetic fields even if the particles are charged. Moreover, the mass of foreign particles are proportional to the third power of the particle radius, whereas the quantity of charge of the foreign particles is proportional to the square of the surface area of the particles or square of the radius, so the specific charge e/m reduces as the particle diameter increases. In other words, it is practically impossible to eliminate foreign particles from the range of the wafer by the method disclosed in patent document 1.

Moreover, the art disclosed in patent document 2 is not realistic from the viewpoint of practical application. It has a large drawback in that the arrangement of the device becomes complex by installing a second plasma generating electrode for generating a high density sub-plasma on the circumference of the lower electrode and a power supply for applying power to the electrode, and the related costs are greatly increased thereby. Moreover, the electrode for generating the second plasma is consumed, possibly becoming the source of foreign particles and contaminants. Even further, the effect of reducing foreign particles which is the initial object of the art falls short of expectations.

At first, since the sub-plasma is generated on the circumference of the lower electrode at which the plasma generating unit and the wafer are not directly opposed, the sub-potential is not sufficiently formed above the wafer from which the foreign particles must be eliminated. In other words, even if a sub-plasma is generated according to the art, its influence does not reach the area above the wafer. This becomes more significant in a high-pressure region in which the diffusion velocity of plasma is low. On the other hand, even if the pressure is reduced and the diffusion velocity of plasma is increased, the fast diffusion speed causes the sub-plasma density distribution above the wafer to become more uniform, by which the desired sub-potential cannot be formed sufficiently. Therefore, it is questionable that the art disclosed in patent document 2 exerts any effect of eliminating foreign particles.

SUMMARY OF THE INVENTION

The present invention aims at solving the problems of the prior art mentioned above. The object of the invention is to provide a plasma processing method and plasma processing device capable of significantly reducing the amount of foreign particles adhering to the wafer during the plasma processing.

In order to reduce the foreign particles falling on the wafer during plasma processing, it is necessary to prevent foreign particles from falling while turning the plasma on and off or while the plasma is unsteady. Therefore, the present inventors have considered whether it is possible to eliminate the foreign particles from the range of the wafer by controlling the shape of the boundary between the sheath (a layer having positive ion space charge) and the bulk (a plasma layer in which positive and negative charges are equally distributed) in which the foreign particles are trapped. As a result, the inventors have discovered that the foreign particles can be eliminated from above the wafer via gravity by controlling the shape of the sheath directly above the wafer to be convexed when the plasma is turned on and off. Moreover, they have discovered that by increasing the average thickness of the sheath formed directly above the wafer when the plasma is turned on and off, the foreign particles can be eliminated from above the wafer by the force of gas flow.

The present invention characterizes in providing a plasma processing device comprising a stage for placing a wafer in a reactor capable of being decompressed and having a desired gas supplied thereto, a first high frequency power supply for applying a high frequency power to generate and maintain a plasma in a reactor, and a second high frequency power supply for drawing ions from the plasma toward the wafer, wherein a thick sheath having a convexed shape is formed above the wafer when turning the plasma on and off.

Furthermore, the present invention characterizes in providing a plasma processing device comprising a stage for placing a wafer in a reactor capable of being decompressed and having a desired gas fed thereto, a first high frequency power supply for applying a high frequency power to generate and maintain a plasma in a reactor, and a second high frequency power supply for drawing ions from the plasma toward the wafer, wherein the second high frequency power is constantly applied when turning the first high frequency power on and off.

According to the present invention, a sheath being thicker at the center area of the wafer and thinner at the outer circumference thereof can be formed by adding a step of applying a low source power and a wafer bias power so as to control the plasma to have an out-high distribution, in order to eliminate the foreign particles trapped in the sheath/bulk boundary out of range of the wafer by gravity and gas flow. According to the invention, the foreign particles adhering to the wafer can be reduced to $\frac{1}{10}$ or less, by which the yield of semiconductor device fabrication can be enhanced. Moreover, the present invention exerts an even more significant effect in eliminating foreign particles with a diameter of 0.1 μm or smaller, which is expected to become a large issue in future device fabrication.

BRIEF DESCRIPTION OF THE DRAWINGS

FIG. 14 is a view showing the increase in number of foreign particles with the timing for applying the source power and bias power varied when turning the plasma on;

DETAILED DESCRIPTION OF THE PREFERRED EMBODIMENTS

The preferred embodiments for carrying out the present invention will now be described with reference to the drawings.

Embodiment 1

Figure 1:
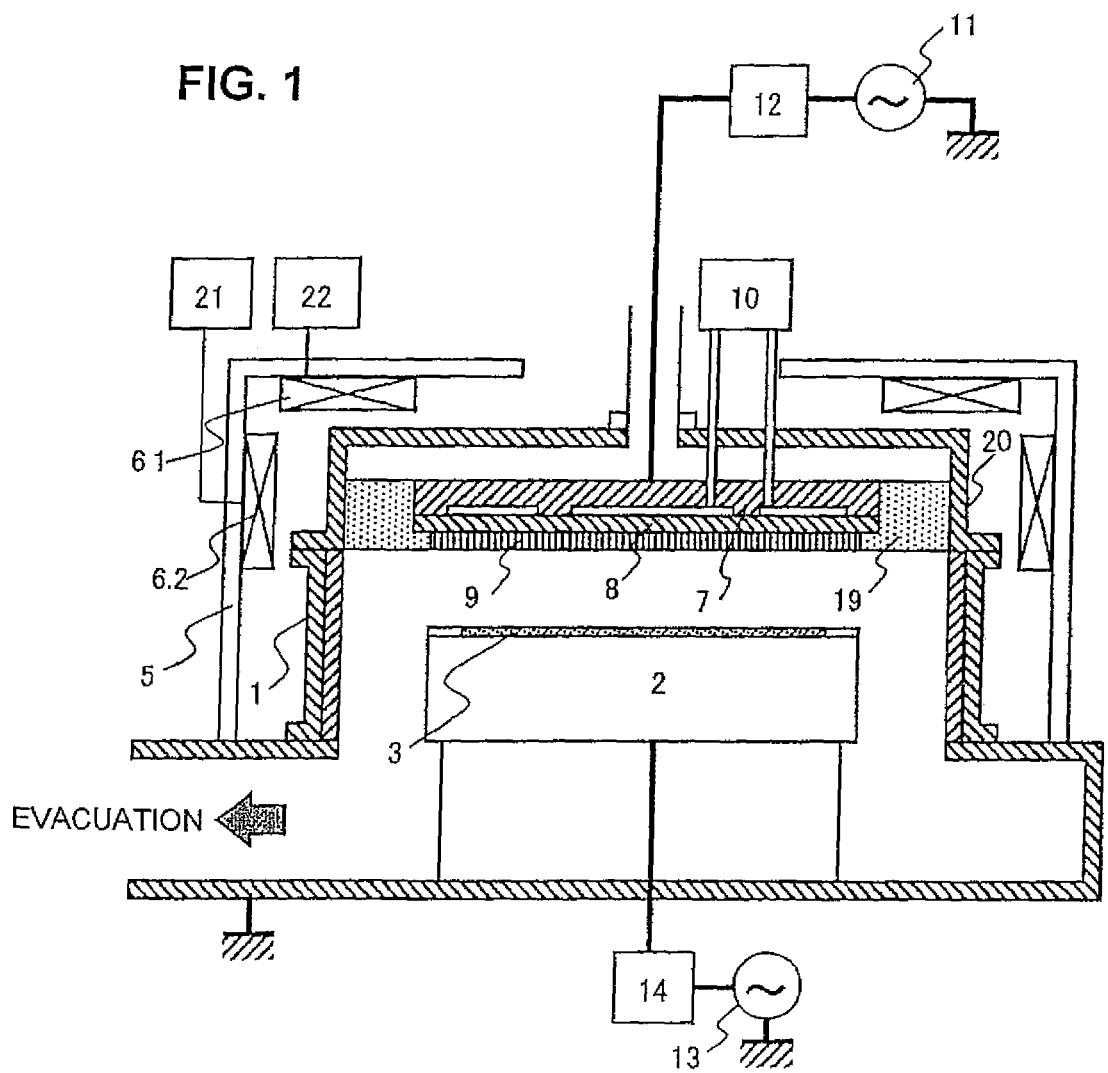
FIG. 1 is a cross-sectional view showing a first embodiment of a plasma processing device according to the present invention.

FIG. 1 illustrates a first embodiment of the present invention. According to the first embodiment of the present invention, the arrangement for carrying out plasma processing comprises an evacuated vacuum processing chamber 1 having a gas introduction means 10, a wafer mounting stage 2 disposed in the vacuum processing chamber 1, and a substantially round antenna 7 arranged in parallel with and facing the stage, wherein the plasma processing is carried out by applying a high frequency power to the antenna from a first high frequency power supply 11 via a first matching network 12 to thereby generate plasma by the interaction between the electromagnetic waves radiated from the antenna and the magnetic field created by the external coils 6.1 and 6.2 and a yoke 5, and applying high frequency bias to the wafer 3 to be processed from a second high frequency power supply 13 and a second matching network 14 connected to the stage 2.

The frequency of the first high frequency power supply 11 is selected within a range of 50 MHz to 500 MHz. By utilizing this frequency band, a plasma having superior efficiency and uniformity can be generated above the wafer, which is in the low to middle pressure range (approximately 0.2 to 50 Pa) most preferable for carrying out fine processing. According to the present embodiment 1, the frequency of the first high frequency power supply is set to 200 MHz.

Furthermore, the frequency of the second high frequency power supply 13 for applying a high frequency bias to the wafer is preferably selected between 100 kHz to 20 MHz, more preferably between 400 kHz to 13.56 MHz, so as not to influence the plasma generated by the first high frequency power and to attract the ions efficiently toward the wafer. According to the present embodiment, the frequency is set to 4 MHz.

Moreover, a magnetic field is generated by applying predetermined currents to the two externals coils 6.1 and 6.2. Plasma can be generated efficiently through the interaction between the electromagnetic waves radiated from the antenna 7 into the processing chamber and the magnetic field, or in other words, a medium density plasma most suitable for processing can be generated using a low source power. Moreover, the profile of the plasma density distribution can be controlled by adjusting the currents applied to the coils 6.1 and 6.2 and by adjusting the magnetic field intensity and the shape of magnetic field lines.

Further according to present embodiment 1, a shower plate 9 is disposed on the surface of the antenna 7. Hundreds of fine bores having a diameter of approximately 0.3 to 0.8 mm are provided on the shower plate 9. Further, a gas dispersion plate 8 having hundreds of fine bores with a diameter of 0.3 to 1.5 mm is disposed between the shower plate and the antenna body 7. A buffer chamber for the processing gas is defined between the gas dispersion plate 8 and the antenna 7, and the processing gas supplied from a gas supply system 10 is introduced uniformly into the processing chamber via the dispersion plate 8 and the shower plate 9.

Further, the above-mentioned gas buffer chamber is divided into two regions, one at the center portion of the antenna and the other at the outer circumference portion of the antenna, through which different processing gases can be supplied independently to the center portion and the outer circumference portion respectively. By changing the gas flow ratio or the gas composition of the gases fed to the inner portion and the outer portion of the processing chamber, a finer process can be carried out in a uniform manner.

Further, the above-mentioned high frequency power supplies, the gas introduction systems, the coil power supply and the like are all controlled by computer, so that an operator is enabled to perform control using a dedicated control software. The system also includes a storage medium for storing a process recipe defining various processing conditions (such as the power of the high frequency power supplies, the coil current and the gas flow rate) composed of multiple steps for carrying out a series of plasma processes.

We will now describe the basis of the present invention that the gravity and gas flow, which were heretofore considered to have very little influence on the behavior of foreign particles, actually have sufficiently large influence on the behavior of foreign particles.

At first, we will describe the force applied on the foreign particles being trapped in the sheath/bulk boundary. At first, the flow of processing gas is disregarded in order to consider the influence of gravity only.

Figure 2:
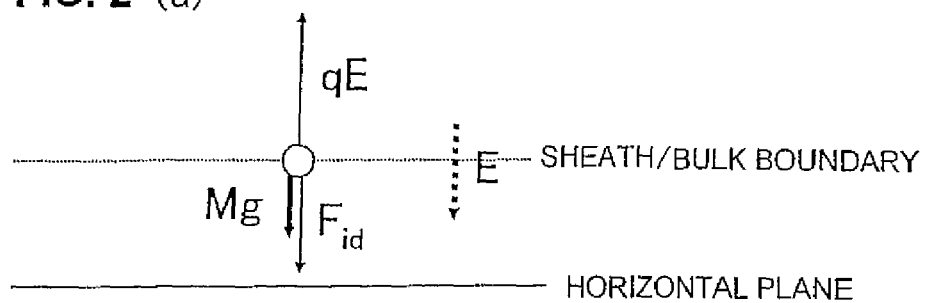
FIG. 2(a)-2(b) are views showing a frame format of the gravity applied on a foreign particle trapped in a sheath/bulk boundary.
Figure 2:
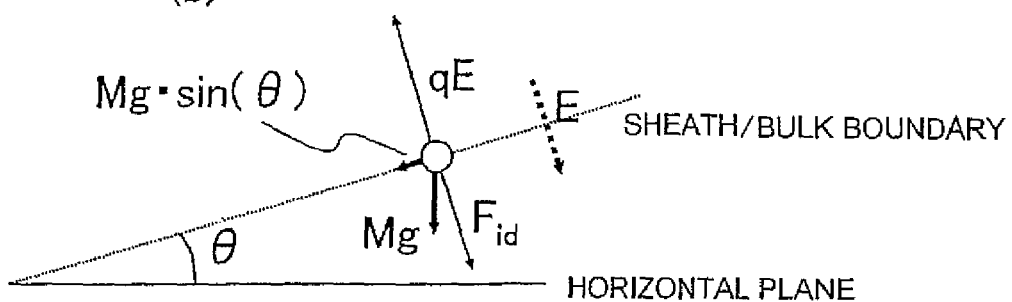

During normal plasma processing, the plasma density above the wafer is substantially uniform from the viewpoint of in-plane uniformity of processing speed, and the thickness of the sheath formed above the wafer is also substantially uniform throughout the whole surface of the wafer, in other words, the sheath/bulk boundary is horizontal. As shown in FIG. 2(a), three forces are applied to the foreign particle having a mass M and negatively charged with charge quantity q, which are, a coulomb force qE applied from the sheath electric field E, an ion drag force Fid applied from positive ions accelerated by the sheath electric field and gravity Mg (wherein g represents acceleration of gravity), and the foreign particle is trapped in a sheath/bulk boundary where the three forces are balanced. Here, the relationship of the magnitude of the three forces is $$F_{id} + Mg = qE. \quad (1)$$

FIG. 2(b) illustrates the force applied to the foreign particle when the sheath/bulk boundary is slanted by some reason for a minute angle θ with respect to the horizontal plane. As illustrated, the coulomb force qE and the ion drag force $F_{id}$ are both applied in the direction parallel to the sheath electric field E, and the direction of the gravity mg is at angle θ to the direction of the sheath electric field E. Thus, the balance of force in the direction parallel to the electric field E is $$F_{id} + Mg\cos(\theta) = qE. \quad (2)$$

In other words, the following force is applied to the foreign particle in the direction perpendicular to the electric field $$Mg\sin(\theta). \quad (3)$$

Generally, when considering the mass of foreign particles in the order of 0.05 μm through 5 μm which cause problems during the plasma process, the amount of charge caused to the foreign particles by the plasma and the sheath electric field intensity, it is considered that the amount of gravity is so little with respect to the coulomb force and the ion drag force that it can be ignored and that it has little influence on the behavior of the foreign particles. For example, if a foreign particle with a diameter of 1 μm and a density of 2.4 g/cm3 is floating in the sheath/bulk boundary of a plasma with a plasma density of $1 \times 10^{10}$ (cm$^{-3}$) and an electron temperature of 3 (eV), the coulomb force and the ion drag force applied to the foreign particle are in the order of approximately $1 \times 10^{-13}$ (N)

whereas the gravity is $1\times10^{-14}$, being one digit smaller. However, this is only true when the sheath/bulk boundary is horizontal and the coulomb force, the ion drag force and the gravity are all applied in the same direction.

Now, if by some reason the sheath/bulk boundary is slanted for θ degrees from the horizontal plane, a component force of gravity defined in expression (3) is applied to the foreign particle, by which the behavior of the particle is influenced. For example, if it is possible to reduce the sheath thickness in the circumference portion of the wafer and slant the sheath/bulk boundary for θ degrees with respect to the horizontal plane in the area where foreign particles exist, the force defined in expression (3) is applied to the foreign particle.

Now, whether the force defined in expression (3) can eliminate the foreign particles to the exterior of the wafer in a practical time scale is estimated. When the initial velocity of the foreign particle at 0 s is 0, the distance r that the foreign particle moves after t seconds is $$r = \tfrac{1}{2} g \sin(\theta) t^2. \qquad (4)$$

Now, the distances r1 and r2 that the foreign particles can move after time t=1s and 2s for certain angles θ1, θ2 . . . are shown in table 1.

TABLE 1

| Angle θ (°) | g sin θ (m/s2) | Moving distance r1 (cm) | Moving distance r2 (cm) |
|---|---|---|---|
| 0.1 | 0.0171 | 0.9 | 3.4 |
| 0.2 | 0.0342 | 1.7 | 6.8 |
| 0.5 | 0.0855 | 4.3 | 17.1 |
| 1 | 0.1710 | 8.6 | 34.2 |
| 2 | 0.3420 | 17.1 | 68.4 |

Table 1 shows that the foreign particles can be eliminated from the wafer radius (r=15 cm) during 1 s if the sheath thickness is maximum at the center of the wafer and minimum at the wafer edge with the angle of the sheath/bulk boundary slanted at 2 degrees with respect to the horizontal plane. Furthermore, even if angle θ is 0.5 degrees, the foreign particles can be eliminated in approximately 2 seconds. Moreover, since expression (4) does not include the mass M of the foreign particles, it is understood that the above-mentioned method for eliminating the foreign particles by controlling the sheath profile is effective for foreign particles of all particle sizes trapped in the sheath/bulk boundary.

Next, it is estimated whether or not it is practically possible to control the angle between the sheath/bulk boundary and the horizontal plane. Non-patent document 2 discloses that when an RF bias is applied to the wafer in plasma, the sheath thickness ds of the RF sheath formed directly above the wafer is expressed by $$d_s = \frac{2}{3} \sqrt{\frac{50\sqrt{2}}{27}} \lambda_D \left(\frac{eV_s}{k_B T_e}\right)^{3/4}. \qquad (5)$$

Here, e represents elementary electric charge, Vs represents potential difference traversing the sheath, kB represents Boltzmann constant, and Te represents electron temperature. Moreover, λD represents Debye length, which can be expressed by the following expression with the electron density represented by Ne and electric constant represented by $\in_0$, $$\lambda_D = (\in_0 k_B T_e / N_e e^2)^{1/2}. \qquad (6)$$

In expressions (5) and (6), the parameter which is controllable to some extent in the wafer plane is the electron density distribution Ne (in other words, plasma density distribution), so Ne should be controlled.

Figure 3:
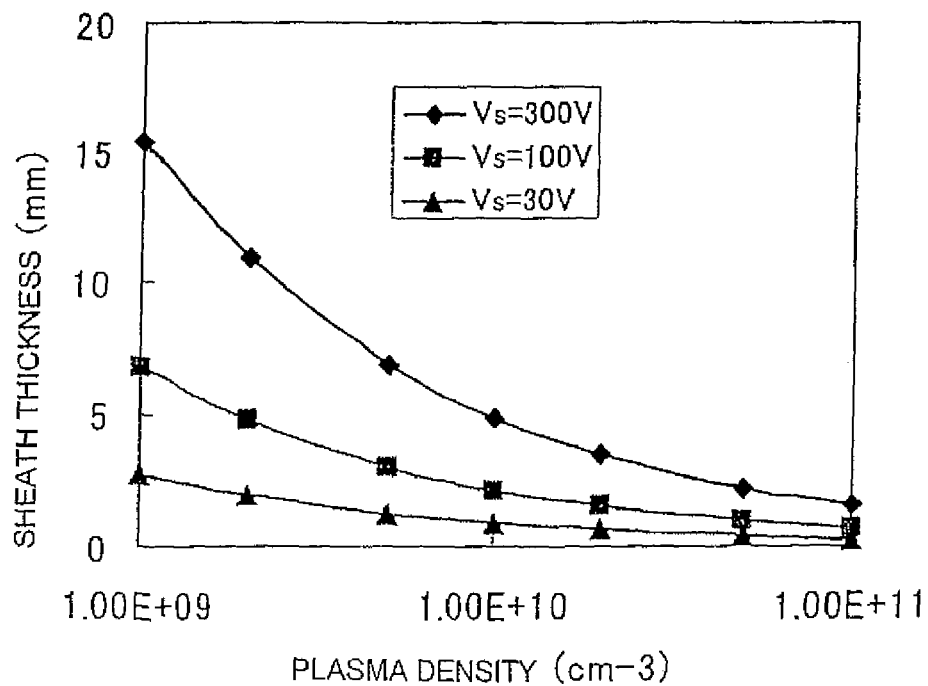
FIG. 3 is a graph showing the results obtained by computing the sheath thickness with the plasma density and sheath voltage varied.

FIG. 3 illustrates the electron density dependency of the sheath thickness ds when the sheath voltage Vs is set as the parameter. It is shown that the change in sheath thickness with respect to the change in plasma density distribution becomes greater as the plasma density becomes lower or as the sheath voltage becomes higher. Furthermore, the present view shows a graph of the plasma density and sheath voltage normally realizable in a plasma processing device generally used for semiconductor fabrication. For example, while applying RF bias so that Vs equals 300 V, if the plasma density at the center portion (r=0 mm) is set to $1\times10^9$ cm$^{-3}$ and the plasma density at the outer circumference portion (r=150 mm) is set to $2\times10^9$ cm$^{-3}$, the sheath thickness differs by approximately 5 mm between the center portion and the outer circumference portion, and the angle θ of the sheath/bulk interface is 1.9 degrees with respect to the horizontal plane, by which the foreign particles trapped above the wafer can be sufficiently eliminated to the outer side of the wafer within 1 s.

The above argument is based on an extremely simplified system, but still, it shows that gravity influences the behavior of the foreign particles and that the particles can be eliminated by forming a convex-shaped sheath profile and utilizing gravity. Moreover, it shows that the plasma density distribution and the sheath voltage for forming a convex-shaped sheath is sufficiently realizable.

The following is an additional description on the general relationship between the sheath voltage Vs, the electron density Ne (related closely to plasma density) and the controllable parameters of the plasma processing device related to the above argument. At first, the electron density Ne increases when the source power Ps (first high frequency power supply) is increased, but it does not depend so much on the bias power Pb (second high frequency power supply). In other words, roughly stated, the following relationship is fulfilled:

$$Ne \propto Ps \qquad (7)$$

This is because in order to independently control the plasma density and the ion energy being incident on the wafer, a relatively high frequency in the order of 10 MHz to several hundred MHz is used as the source frequency and a relatively low frequency in the order of several hundred KHz to 14 MHz is used as the bias frequency. The bias power Pb does not influence the plasma density, and controls the ion energy, or Vs. Here, when the bias power Pb is increased, the sheath voltage Vs is increased thereby. In other words, roughly stated, the following relationship is fulfilled:

$$Vs \propto Pb \qquad (8)$$

On the other hand, when the source power Ps is increased, the sheath voltage Vs is reduced. This is because the plasma density rises along with the increase of source power, and the bias current Ib conducted through the plasma is increased. In other words, roughly stated, the bias power Pb can be expressed as $$Pb = IbVs \propto NeVs \propto PsVs. \qquad (9)$$

Thus, when the source power Ps is increased with the bias power Pb fixed, the sheath voltage Vs is reduced.

Figure 4:
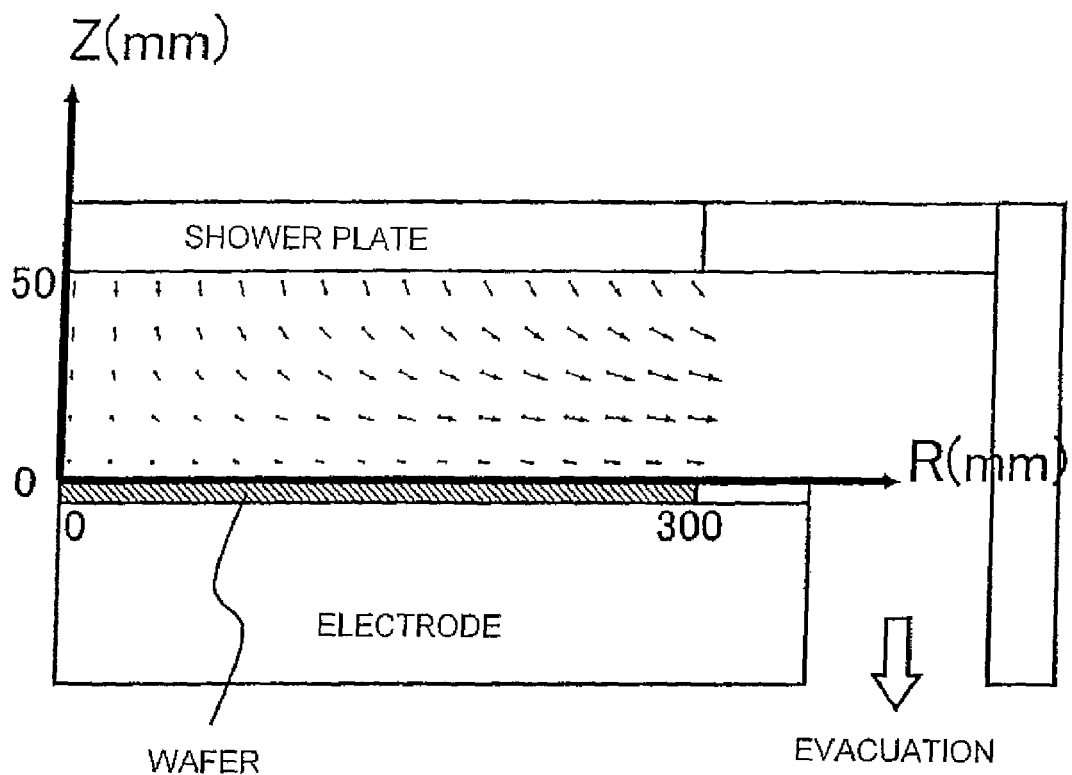
FIG. 4 is a view showing the results obtained by computing the gas flow rate vectors within the reactor.

Next, the influence of gas flow is estimated. At first, in order to estimate the degree of gas flow rate at the sheath/bulk boundary, the gas flow rate distribution within the processing chamber is calculated using a general fluid calculation code. FIG. 4 shows the computed results of the gas flow rate vector when the processing gas mass flow is 200 sccm and the pressure is 5 Pa, and the summary of the computational system. It shows that directly above the wafer, the rate vector of the processing gas has a large radial component Vr with respect to the vertical component Vz perpendicular to the wafer plane.

Figure 6:
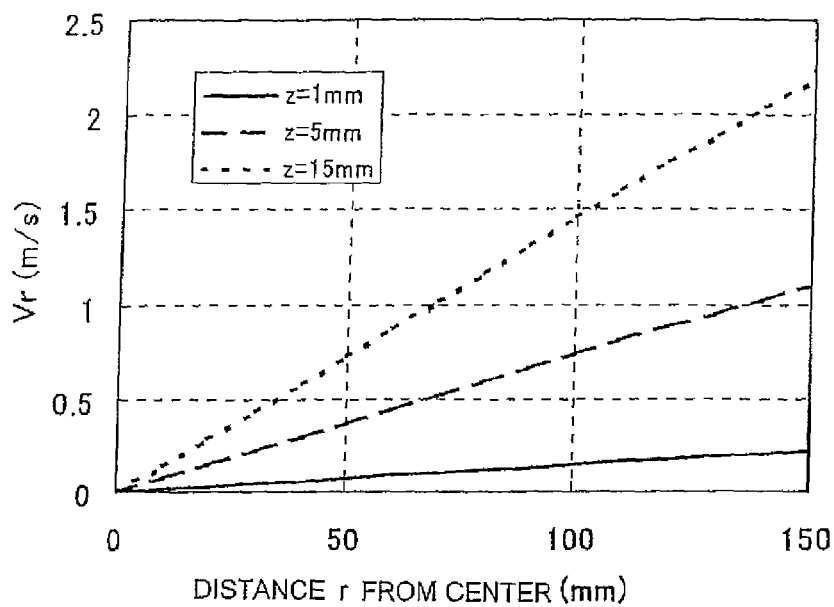
FIG. 6 is a graph showing the radial position dependency of a radial component Vr of the gas flow rate within the reactor.

FIG. 6 illustrates the radial direction dependency of component Vr of the flow rate vector at various heights. The Vr is 0 m/s at the center portion r=0 mm, and increases linearly toward the outer circumference. At this time, when z=1 mm, the average value of the radial component Vr of the gas flow rate in the radial position was 0.11 m/s according to the present computation results.

According to non-patent document 3, the force Fg applied to a static particle from the surrounding gas flow can be expressed as $$Fg = NV^2 m\pi r_p^2. \tag{10}$$

Here, N represents gas density, V represents gas flow rate, m represents mass of gas particle, and rp represents particle radius. Expression (10) shows the force applied to a motionless particle from the surrounding gas flow. As the particle starts moving by the flow and approximates the speed of gas flow, the force applied to the particle from the gas flow reduces. In other words, upon considering the velocity of the particle, the force applied to the particle from the gas flow can be expressed by $$Fg = N(V - V_p)^2 m\pi r_p^2. \tag{11}$$

Here, Vp represents the velocity of the particle. Expression (11) shows that the force applied to the foreign particle is proportional to the cross-sectional area of the particle and the gas density, and is also proportional to the square of the relative velocity of the particle and gas.

Figure 5:
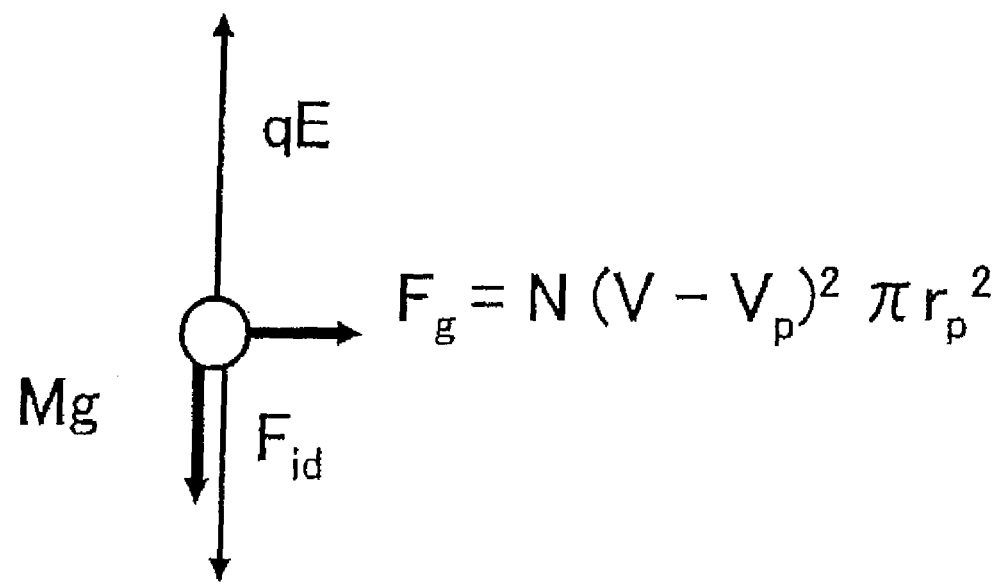
FIG. 5 is a view showing a frame format of the force applied from gas flow to the foreign particles trapped in a sheath/bulk boundary.

Now, assuming that the mass of gas particles is equivalent to Ar, the diameter of the foreign particle is 1 μm and the gas flow rate is 0.11 m/s, the Fg applied to a static foreign matter is as small as $2 \times 10^{-14}$ (N), which is one digit smaller than the aforementioned ion drag force and the coulomb force. The direction in which the force Fg by gas flow is applied is substantially perpendicular to the direction in which the ion drag force and the coulomb force are balanced, as shown in FIG. 5, so the force Fg by gas flow influences the behavior of the foreign particle.

Here, the acceleration αg when Fg is applied to a foreign particle having a mass M is $$\alpha g = Fg./M \tag{12}$$

If the density of the foreign particle is 2.4 g/cm3, the mass M of the foreign particle can be computed based on the particle diameter. At this time, by assuming that at time t=0 the initial position of the foreign particle is r0=0.01 (m) and the initial velocity of the foreign particle is Vp (0)=0 m/s, the progress by time of the position of the particle can be computed from the results of FIG. 6 and expressions (11) and (12).

Figure 7:
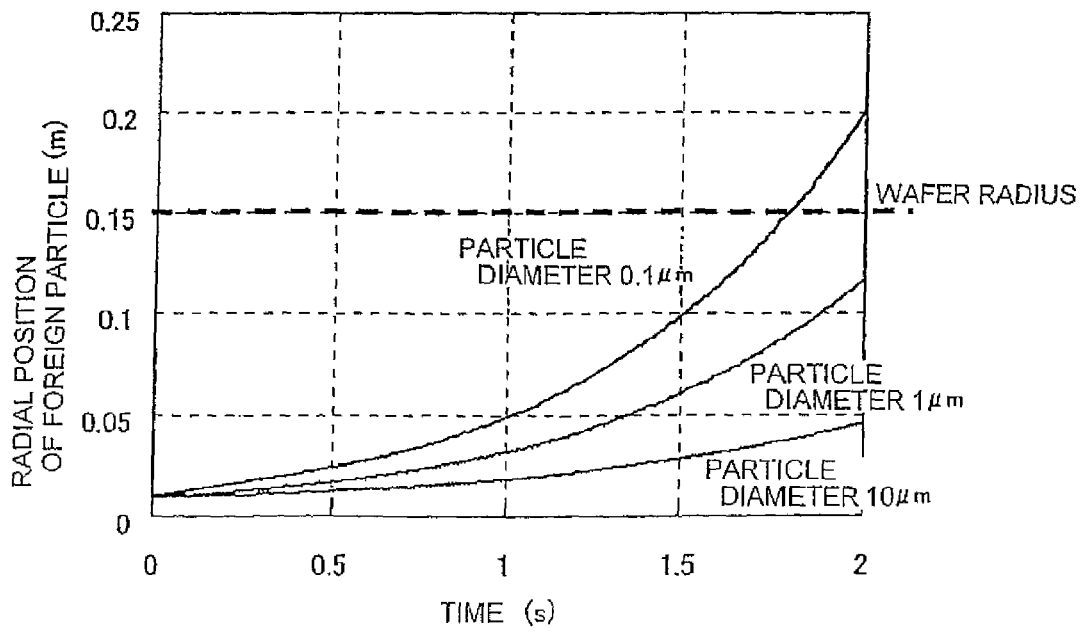
FIG. 7 is a graph showing the time dependency of the radial position of a foreign particle when the sheath/bulk boundary is z=1 mm.

Now, FIG. 7 shows the dependency to time of the radial position of the foreign particle when the sheath/bulk boundary is at z=1 mm. As can be seen, the position of the foreign particle being moved by the gas flow is dependent on the diameter of the particle. Since the foreign particle mass M in expression (11) is proportional to the third power of the foreign particle diameter and the force Fg by gas in expression (10) is proportional to the cross-section of the particle or square of the foreign particle diameter, the influence of the gas flow increases as the foreign particle diameter decreases. Thus, the elimination of foreign particles by gas flow exerts a great effect in eliminating foreign particles having a particle diameter of 0.1 μm or smaller, which may become a major issue in the near future.

It can be seen from FIG. 7 that foreign particles having a diameter of 0.1 μm is eliminated from the range of the wafer within 2 seconds, but foreign particles having diameters of 1 μm and 10 μm are still within the range of r<0.15 m, which means that they are not eliminated from the range of the wafer. However, it is clear that if the gas mass flow is increased, the gas flow rate near the wafer is increased and the particle elimination effect can be enhanced. However, by reducing the pressure and maintaining the gas mass flow, the gas flow rate can be increased but the gas density is reduced, so the Fg in expression (10) does not change, and as a result, the particle elimination effect is also unchanged.

Figure 8:
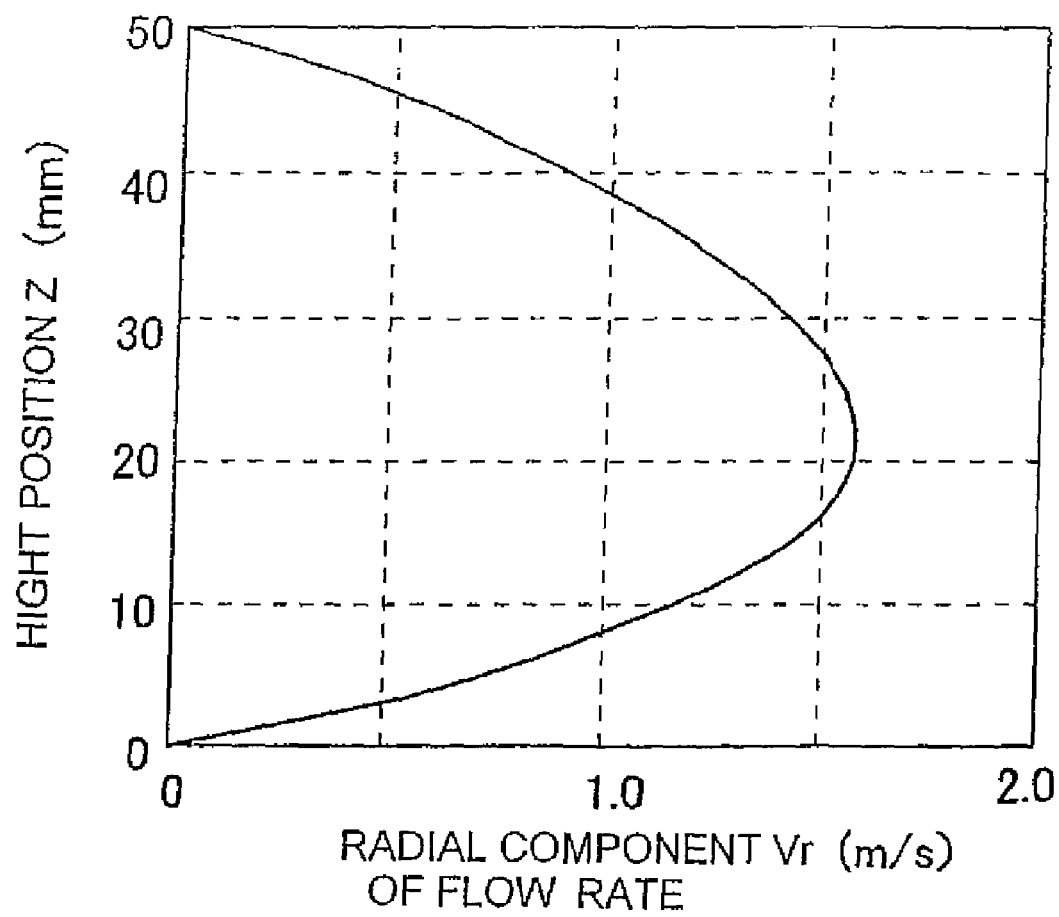
FIG. 8 shows the height dependency of a radial velocity component Vr when r=100 mm.

FIG. 8 shows the height dependency of the radial velocity component Vr when r=100 mm. The present view shows that the gas flow rate near the wafer increases drastically as the distance from the wafer increases. In other words, by increasing the height in the z direction in which the foreign particles is trapped by either reducing the plasma density or raising the sheath voltage, the elimination of foreign particles by gas flow can be performed more effectively.

In conclusion of the above description, by controlling the sheath to have a convexed shape, the foreign particles trapped in the sheath/bulk boundary above the wafer can be eliminated to the area outside the wafer by gravity. Further, by increasing the average thickness of the sheath, the foreign particles trapped in the sheath/bulk boundary above the wafer can be eliminated from the range of the wafer by the force of flow of the processing gas. Moreover, the same effect can be further enhanced by utilizing both of the above properties. The foreign particles causing deterioration of yield can be reduced by carrying out the process of eliminating foreign particles when turning the plasma on and off.

Figure 9:
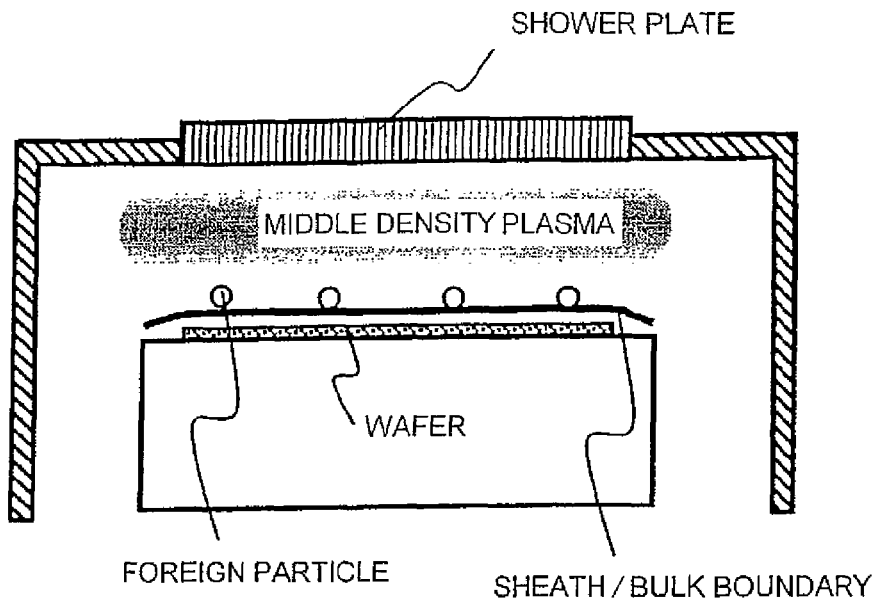
FIG. 9(a)-9(b) are views showing a frame format of the foreign particle elimination realized through sheath shape control.
Figure 9:
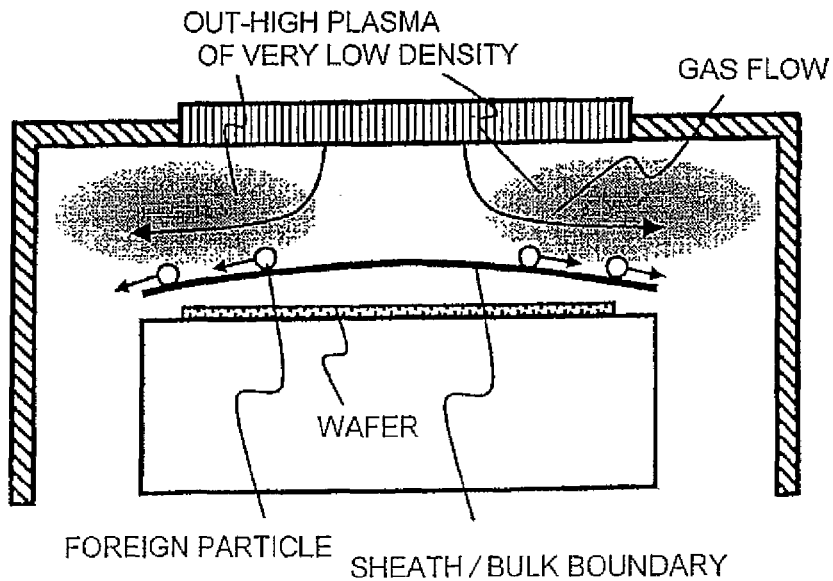

Next, the method of reducing foreign particles using the plasma processing device according to the present invention will be described. At first, the basic concept of the device is illustrated in FIG. 9. During normal wafer processing (main step), a uniform plasma is generated above the wafer as illustrated in FIG. 9(a). In this state, the sheath width above the wafer is also uniform, and the sheath/bulk interface is horizontal. In this case, the foreign particles generated in the process are trapped in the sheath/bulk boundary and floats above the wafer. Further, normally a medium density plasma (approximately $1 \times 10^{10}$ to $1 \times 10^{11}$ cm−3) is utilized from the viewpoint of processing speed, so the sheath thickness formed above the wafer is thin and the force of gas flow is not so much applied on the foreign particles.

Since the conditions for wafer processing is determined by factors such as processing performance, processing speed, selectivity and uniformity, they cannot be changed only from the viewpoint of reducing foreign particles. However, as mentioned earlier, the foreign particles are trapped during the plasma process and rarely drop on the wafer.

Therefore, as shown in FIG. 9(b), just before turning the plasma off, a control is carried out to lower the source power (power of the first high frequency power supply) to reduce the plasma density and to increase the coil current, so that the plasma density distribution is higher above the outer circumference of the wafer and lower above the center of the wafer, and the form of the sheath is convexed (step of eliminating foreign particles). Since the processing gas flow rate increases away from the wafer, by increasing the sheath thickness, greater force is applied to the foreign particles from the gas flow by which the particles are eliminated out of range of the wafer. Furthermore, by controlling the shape of the sheath to be convexed, the gravity applied to the foreign particles operates in a direction eliminating the particles out of range of the wafer. Thus, due to the influence of gas flow and gravity, the foreign particles trapped above the wafer can be eliminated from the range of the wafer and will not fall onto the wafer when the plasma is turned off. Of course, it is desirable from the viewpoint of eliminating foreign particles to increase the processing gas flow in the above-mentioned step directly prior to turning off the plasma.

Further, in order to reduce foreign particles, it is effective to carry out the step of eliminating foreign particles illustrated in FIG. 9(b) when turning the plasma on. This is effective since the foreign particles floating over the wafer can be prevented from dropping on the wafer from the start of plasma processing to the time in which a sheath is stably formed above the wafer. In a normal process sequence, the source power (first high frequency power) is applied at first, and after the plasma is ignited, the bias power (second high frequency power) is applied, but according to the present invention, the bias power is applied before the plasma is ignited by the source power, so that when the plasma is ignited, a desirable sheath is already formed above the wafer. Moreover, since the plasma density is suppressed to a low value in the foreign particle elimination step during the ignition, it will not affect the process results of the main process.

Now, the actual plasma processing sequence will be described in detail with reference to FIG. 10.

As the first step, current is applied to the coil, gas is introduced to the processing chamber and the pressure is controlled to processing pressure immediately prior to turning on the plasma (usually about 1 to 5 seconds in advance). At this time, in order to generate an out-high plasma, a current of 7 A, for example, is applied to the coil 6.1. Further, of the two (inner and outer) systems for introducing gas, a processing gas of 800 ml/min, for example, is introduced to the inner gas introduction system. By introducing gas from the inner side, it is possible to enhance the effect of eliminating foreign particles by the gas flow.

Next, as the second step, a bias power in the range of approximately 5 W through 100 W, for example, 30 W, is applied from the second high frequency power supply at least immediately prior to (approximately 0 to 1 seconds prior to) starting the supply of source power from the first high frequency power supply. This level of power does not cause plasma to be generated since a frequency of 4 MHz is used for the bias power. The reason for applying the bias power prior to applying the source power is to form a sheath above the wafer instantly when the source power is applied in the following step to turn the plasma on.

Next, as the third step, a source power of approximately 100 W to 400 W is applied to generate plasma. At this time, the source power should preferably be around the minimum value at which the plasma is stably turned on, which is about 200 W, for example, since it is desirable to suppress the plasma density. The plasma generated in this step has low density since the source power is low, the plasma distribution has an out-high distribution due to magnetic field control, and a thick convex-shaped sheath is formed above the wafer from the moment the plasma is turned on since bias is applied in advance. This step is the foreign particle elimination step described previously. The present step usually takes about 0.5 to 1 seconds.

Thereafter, a step for actually processing the wafer by plasma is performed as the fourth step. At the start of the step, the source power, the bias power, the coil current, the inner/outer gas flow rate and the like are changed to match the conditions for carrying out normal plasma processing. According to normal processing conditions, the source power is usually greater than the foreign particle elimination step, or about 1000 W, for example, the bias power is also greater, or about 800 W, for example, and in order to realize a magnetic field condition for performing a uniform plasma processing, the coil current is set to 4 A, for example, and the inner/outer gas flow rate for performing a uniform plasma processing is set so that the inner flow rate is 400 ml/min and the outer flow rate is 400 ml/min, for example. Moreover, the time required to carry out the present step depends on the actual process, and is usually about 10 to 300 seconds.

Next, a foreign particle elimination step is carried out as the fifth step. Upon starting the present step, various discharge parameters are changed to similar conditions as those of the third step, and the discharge is continued for about 1 to 5 seconds. The third step is performed only for a short time since the object thereof is to prevent foreign particles from adhering to the wafer during a very short time while the plasma is turned on, but on the other hand, the object of the fifth step is to eliminate the foreign particles floating above the wafer from the range of the wafer, so the present step requires longer time. At the end of the present step, the source power is set to 0 and the plasma is turned off. At this time, the wafer bias is still applied.

Next in the sixth step, the wafer bias is turned off, and in the seventh step, the coil current is turned off to stop the introduction of gas.

The use of the above-described plasma processing device and plasma processing method realizes a significant reduction of foreign particles falling on the wafer during plasma processing. Of course, the values of the high frequency power supplies, the coil currents, the gas flow rates, the duration time of steps and the like in the present description are mere examples, and they are not intended to restrict the range of the present invention in any way.

Figure 10:
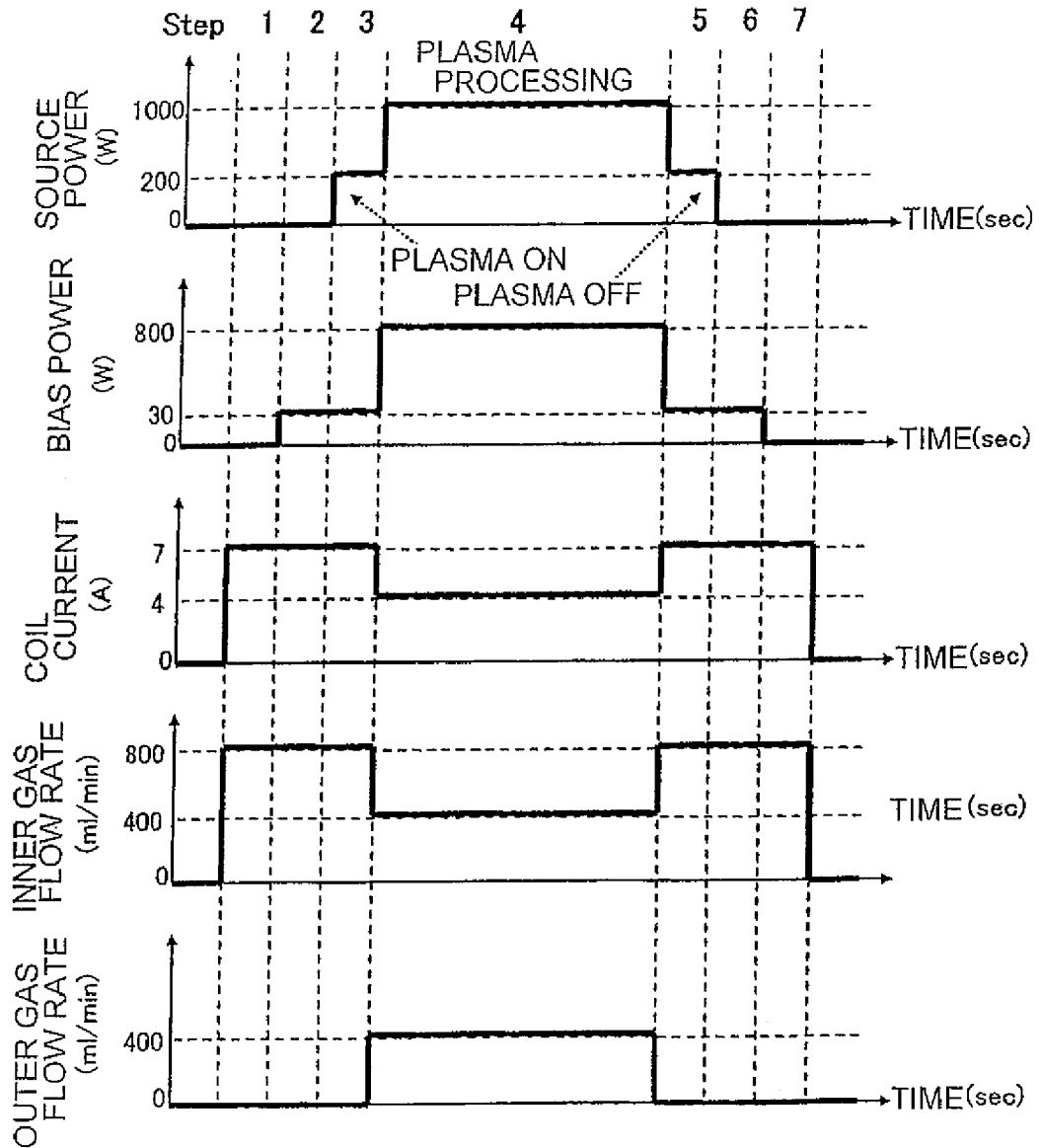
FIG. 10 is a view showing a frame format of one example of a discharge sequence according to the first embodiment of the plasma processing device according to the present invention.
Figure 11:
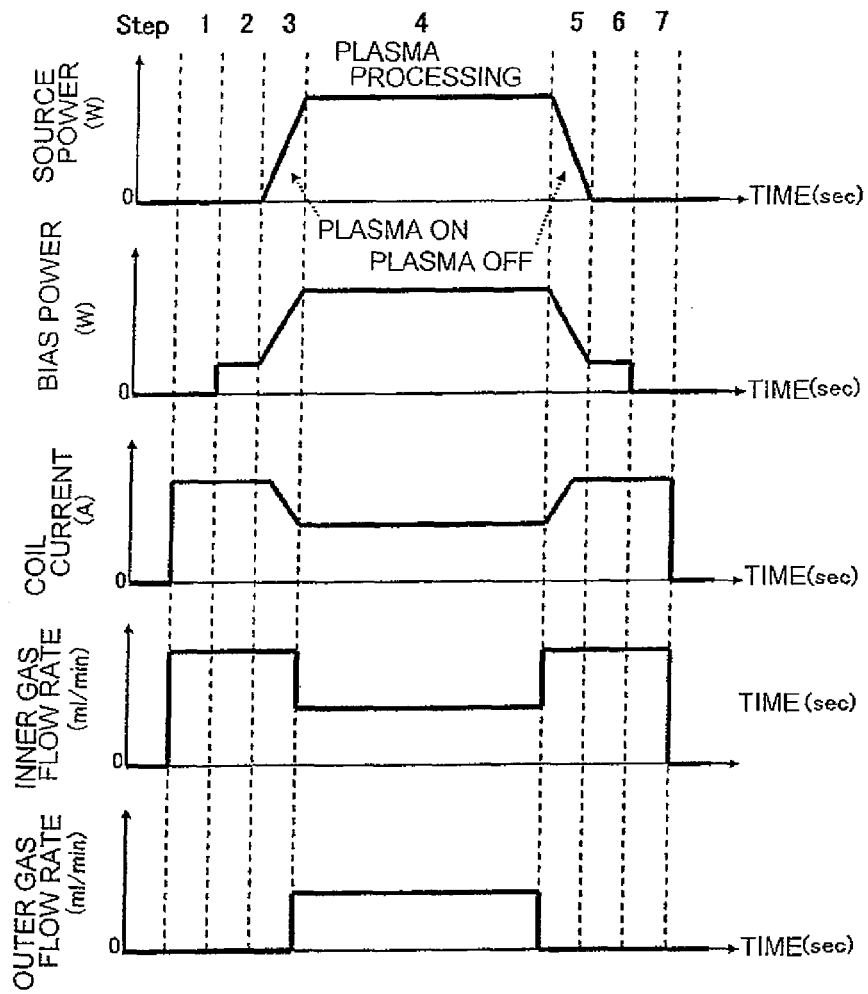
FIG. 11 is a view showing another example of a discharge sequence by the first embodiment of the plasma processing device according to the present invention.

Next, FIG. 11 illustrates a plasma processing sequence that varies slightly from the sequence illustrated in FIG. 10. Same as the sequence of FIG. 10, the present sequence includes a third step and a fifth step for eliminating foreign particles when turning the plasma on and off. What differs from the plasma processing sequence of FIG. 10 is that in the foreign particle elimination steps, the source power, the bias power and the coil current are varied gradually. According to such control, the plasma conditions are prevented from changing drastically, according to which foreign particle elimination effects are enhanced.

Next, the results showing the effects for reducing foreign particles by performing the sheath shape control according to the present invention will be described with reference to FIGS. 12 through 14. In the drawings, the increase in number of foreign particles is the value acquired by counting the foreign particles adhered to the surface of the Si wafer for foreign particle evaluation before and after exposing the wafer to plasma, and subtracting the measured value prior to exposure to plasma from the measured value after the exposure to plasma.

Figure 12:
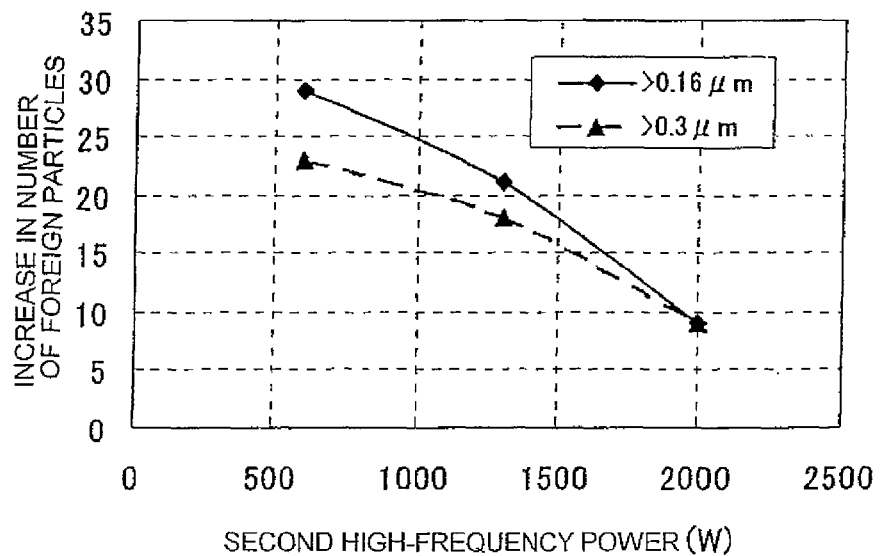
FIG. 12 is a view showing a second high frequency power dependency of the increase in number of foreign particles.

At first, FIG. 12 shows the result of investigating the expected effects for reducing foreign particles when the sheath shape is varied. In FIG. 12, the plots indicated by the square mark and the solid line show the results of the investigation on foreign particles having a particle diameter of 0.16 μm and greater, and the plots indicated by the triangle and the dotted line show the results of the investigation on foreign particles having a particle diameter of 0.3 μm and greater. According to common conditions, the source power (first high frequency power) is 1000 W, the coil current is 4 A, the total flow rate of the mixed gas of Ar/CHF3/N2 is 800 ml/min and the pressure is 4 Pa, and the bias power (second high frequency power) is sequentially varied between 600 W, 1300 W and 2000 W in order to check the change in the number of foreign particles. At this time, the wafer Vpp (Vpp∝Vs) were 655 V, 1172 V and 1605 V, respectively. It is shown in FIG. 12 that the number of foreign particles is reduced as the bias power is increased. One reason for this is considered to be that the increase of bias power causes the Vpp to increase and the sheath voltage Vs to also increase, by which the sheath thickness increases as illustrated in FIG. 3, resulting in the enhancement of foreign particle elimination effects by gas flow.

Another reason of the enhanced elimination effects is that due to the increase of bias power, the plasma has an out-high distribution and thus the sheath has a convexed shape, by which the effect of eliminating foreign particles by gravity is realized. The plasma distribution differs according to the value of the wafer bias even when the coil current is not changed, and it has been measured in advance that the uniformity of the plasma distribution is somewhat middle-high (5%) when the bias is 600 W, out-high (10%) when the bias is 1300 W, and out-high (20%) when the bias is 2000 W. Further, it can be recognized from the present results that by realizing an out-high plasma distribution and increasing the sheath thickness, it is possible to reduce the number of foreign particles to approximately ⅓.

Figure 13:
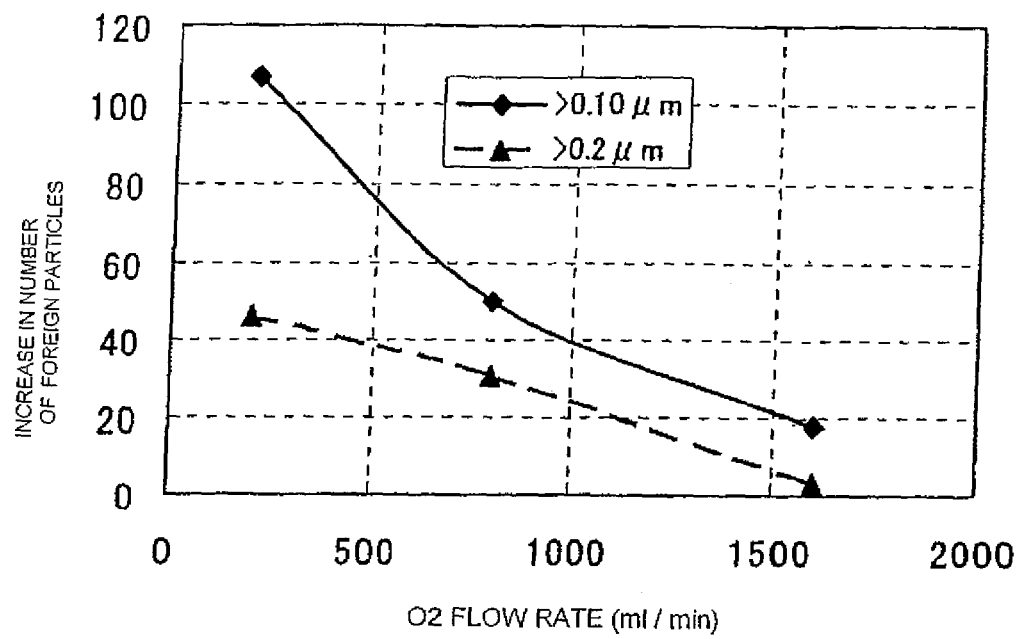
FIG. 13 is a view showing the $O_2$ flow dependency of the increase in number of foreign particles.

FIG. 13 shows the result of the experiment conducted by varying only the gas flow rate and not changing the other conditions when turning off the plasma. In FIG. 13, the plots indicated by the square mark and the solid line show the results of the investigation on foreign particles having a particle diameter of 0.10 μm and greater, and the plots indicated by the triangle and the dotted line show the results of the investigation on foreign particles having a particle diameter of 0.2 μm and greater. According to common conditions, the source power is 1000 W, the bias power is 200 W, the coil current is 5 A, the O2 flow rate is 800 ml/min, and the pressure is 4 Pa, wherein the O2 flow rate is changed to 200 ml/min or 1600 ml/min one second prior to turning off the plasma. In the drawing, the plot corresponding to 800 ml/min shows the result in which the gas flow rate was not changed. From the present view, it can be seen that by increasing the gas flow rate to 1600 ml/min when turning off the plasma, the number of foreign particles are reduced to approximately ⅓ to ⅕. The present results show that along with the increase of gas flow, the effect of eliminating foreign particles by gas flow has been enhanced. In contrast, by reducing the O2 gas flow to 200 ml/min, the number of foreign particles is approximately doubled.

Figure 14:
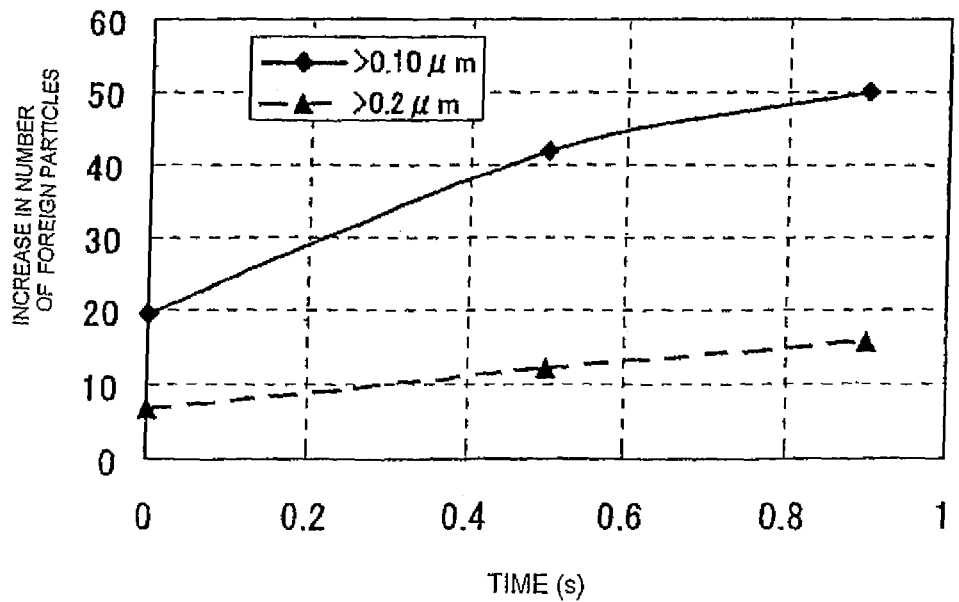

FIG. 14 shows the results in which the timings of applying the source power and bias power are changed when turning on the plasma. In FIG. 14, the plots indicated by the square and the solid line show the results of the investigation on foreign particles having a particle diameter of 0.10 μm and greater, and the plots indicated by the triangle and the dotted line show the results of the investigation on foreign particles having a particle diameter of 0.2 μm and greater. The "time" on the horizontal axis shows the time difference from the time the source power is applied to the time the bias power is applied. In other words, the plots at 0.5 s show the results taken by applying the bias 0.5 seconds after the source is applied and plasma is ignited. Furthermore, the plots at 0 s show the results taken by applying the source power to ignite plasma while having a bias power of 30 W applied in advance. It can be seen from the present results that by applying a bias in advance when turning on the plasma to form a sheath above the wafer, the number of foreign particles is reduced to approximately ⅓ compared to other cases.

It can be seen from the results of FIGS. 12 through 14 that foreign particles can be effectively reduced by forming a sheath above the wafer, forming a sheath with a convexed shape, and increasing the gas flow rate when turning the plasma on and off. Moreover, by simultaneously utilizing all the means mentioned above, the foreign particles adhered on the wafer can be expected to be reduced to more than ¹/₁₀. Further, since the elimination of foreign particles by gas flow is effective in eliminating foreign particles having smaller diameters, it exerts a significant effect in eliminating foreign particles having a diameter of 0.1 μm or smaller which is considered to become a large issue in future fine processing of devices.

Embodiment 2

Figure 15:
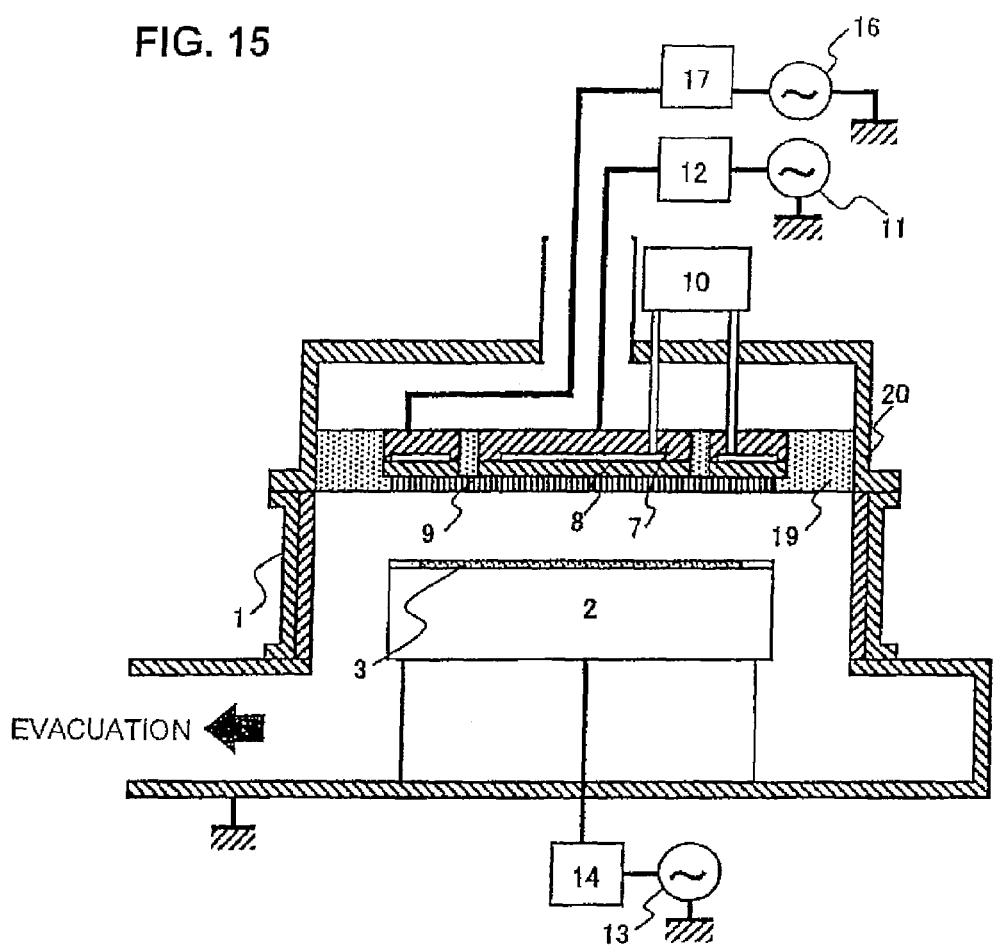
FIG. 15 is a cross-sectional view showing a second embodiment of the plasma processing device according to the present invention.

FIG. 15 illustrates a second embodiment of the present invention. In the basic arrangement of the present embodiment, explanations on the components common to embodiment 1 are omitted. In embodiment 2, the antenna portion is separated into an inner portion and an outer portion by an insulator, and a first high frequency power supply 11 and a third high frequency power supply 16 are connected to the inner antenna and the outer antenna, respectively. In the present embodiment, the method for controlling the plasma distribution differs from that of the first embodiment. That is, an out-high plasma is realized by increasing the power applied to the outer antenna. Thus, the sheath can be controlled to a convexed shape when turning the plasma on and off.

Embodiment 3

Figure 16:
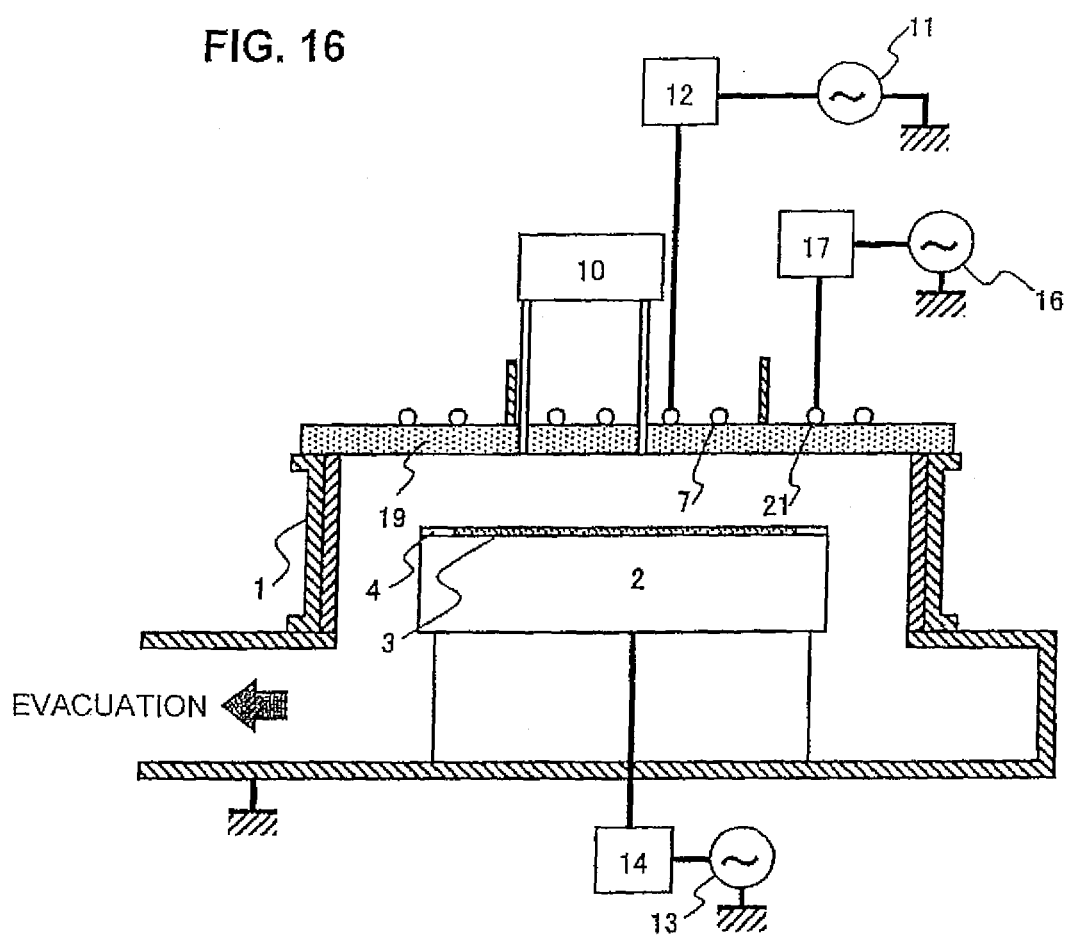
FIG. 16 is a cross-sectional view showing a third embodiment of the plasma processing device according to the present invention.

FIG. 16 illustrates a third embodiment of the present invention. Explanations on the components common to the aforementioned embodiments are omitted. In the present embodiment, the antenna for generating and maintaining plasma is an induction-type antenna. A dielectric plate 19 for maintaining vacuum and transmitting induced electric field is provided on the upper portion of the vacuum processing chamber 1, and two lines of inductive antennas 7 and 21 are provided above the dielectric plate. A first high frequency power supply 11 is connected to the inner inductive antenna and a second high frequency power supply 16 is connected to the outer inductive antenna. Also according to the present embodiment, an out-high plasma is realized by increasing the power applied to the outer antenna. Thus, the sheath can be controlled to have a convexed shape when the plasma is turned on and off.

Figure 17:
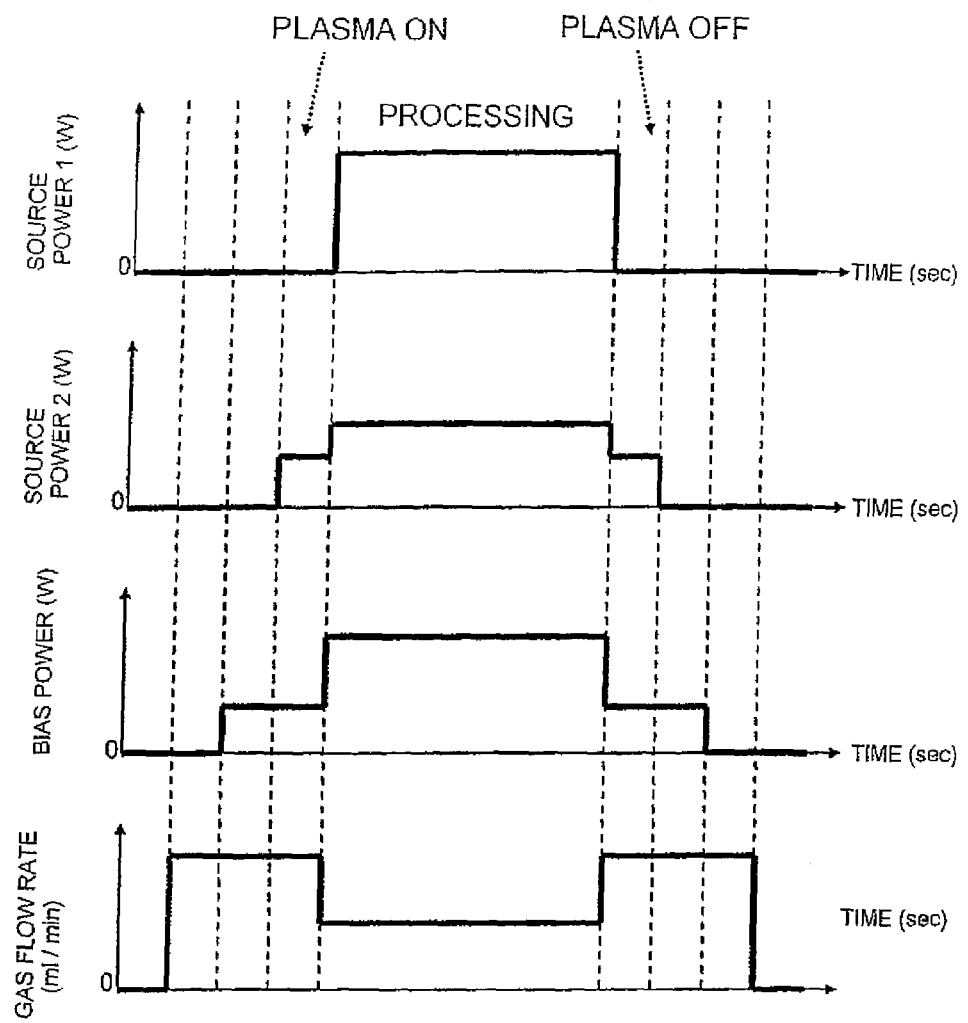
FIG. 17 is a frame format showing one example of a discharge sequence according to the second and third embodiments of the plasma processing device according to the present invention.

Next, FIG. 17 shows the method for reducing foreign particles based on embodiment 2 or embodiment 3. The basic idea is the same as that of the first embodiment, but the difference is that a third high frequency power is applied to form an out-high plasma distribution.

What is claimed is:
1. A semiconductor processing method comprising:
 a step of introducing a processing gas from an upper portion of a wafer stage into a processing chamber;
 a step of processing a semiconductor wafer located on the wafer stage in the processing chamber, by using plasma generated inside the processing chamber; and
 a step of forming a sheath layer with convex shape above the semiconductor wafer, the sheath layer being shaped thicker in a central region above the semiconductor wafer and thinner in an outer circumferential region above the semiconductor wafer, thereby enabling trap- ping and then eliminating foreign particles disposed on an upper region of the semiconductor wafer, the particles being initially trapped in a boundary between the sheath layer and a plasma bulk layer;

wherein the step of forming the sheath layer is performed between the step of introducing the processing gas and the step of processing the semiconductor wafer, or after the step of processing the semiconductor wafer but before an extinction of the plasma.

2. A semiconductor processing method according to claim 1, wherein the step of forming the sheath layer, when performed between the step of introducing the processing gas and the step of processing the semiconductor wafer, includes a step of applying a source power to generate plasma in a space above the semiconductor wafer inside the processing chamber, the step of applying a source power being performed after a step of applying a bias power to the wafer stage that does not generate plasma in the processing chamber, the plasma being generated by the source power with a distribution higher above the outer circumferential region and lower above the central region of the semiconductor wafer.

3. A semiconductor processing method according to claim 1, wherein the step of forming the sheath layer, when performed after the step of processing the semiconductor wafer but before an extinction of the plasma, includes a step of applying a source power to generate plasma in a space above the semiconductor wafer inside the processing chamber while the bias power to the wafer stage is applied, the plasma being generated by the source power with a distribution higher above the outer circumferential region and lower above the central region of the semiconductor wafer.

4. A semiconductor processing method according to claim 2, wherein the step of forming the sheath layer, when performed after the step of processing the semiconductor wafer but before an extinction of the plasma, includes a step of applying a source power to generate the plasma in a space above the semiconductor wafer inside the processing chamber while the bias power to the wafer stage is applied, the plasma being generated by the source power with a distribution higher above the outer circumferential region and lower above the central region of the semiconductor wafer.

5. A semiconductor processing method according to claim 4, wherein a period time of the step of forming the sheath layer, when performed after the step of processing the semiconductor wafer but before an extinction of the plasma, is longer than a period time of the step of forming the sheath layer, when performed between the step of introducing the processing gas and the step of processing the semiconductor gas.

6. A semiconductor processing method according to claim 1, wherein a flow rate of the processing gas introduced into the processing chamber is increased during the step of forming the sheath layer and eliminating the particles from an upper region of the semiconductor region.

7. A semiconductor processing method comprising a step of introducing a processing gas from an upper portion of a wafer stage into a processing chamber and a step of processing a semiconductor wafer located on the wafer stage in a processing chamber using plasma generated inside the processing chamber, the semiconductor processing method further comprising:

a step of forming a sheath layer with convex shape above the semiconductor wafer and eliminating particles from the upper region of the semiconductor wafer, the sheath layer being shaped larger in thickness in a central region above the semiconductor wafer and smaller in an outer circumferential region and the particles being initially trapped in a boundary between the sheath layer and a plasma bulk;

wherein the step of forming the sheath layer being operated between the step of introducing the processing gas and the step of processing the semiconductor wafer or before an extinction of the plasma after the step of processing the semiconductor wafer.

8. A semiconductor processing method according to claim 7, wherein the step of forming the sheath layer between the step of introducing the processing gas and the step of processing the semiconductor wafer includes a step of applying a source power to generate plasma in a space above the semiconductor wafer inside the processing chamber after a step of applying a bias power to the wafer stage that does not generate the plasma in the processing chamber, the plasma being generated by the source power with a distribution higher above the outer circumferential region and lower above the central region of the semiconductor wafer.

9. A semiconductor processing method according to claim 8, wherein the step of forming the sheath layer before an extinction of the plasma after the step of processing the semiconductor wafer includes a step of applying a source power to generate the plasma in a space above the semiconductor wafer inside the processing chamber while the bias power to the wafer stage is applied, the plasma being generated by the source power with a distribution higher above the outer circumferential region and lower above the central region of the semiconductor wafer.

10. A semiconductor processing method according to claim 9, wherein a period time of the step of forming the sheath layer before an extinction of the plasma after the step of processing the semiconductor wafer is longer than a period time of the step of forming the sheath layer between the step of introducing the processing gas and the step of processing the semiconductor gas.

11. A semiconductor processing method according to claim 7, wherein the step of forming the sheath layer before an extinction of the plasma after the step of processing the semiconductor wafer includes a step of applying a source power to generate plasma in a space above the semiconductor wafer inside the processing chamber while the bias power to the wafer stage is applied, the plasma being generated by the source power with a distribution higher above the outer circumferential region and lower above the central region of the semiconductor wafer.

12. A semiconductor processing method according to claim 7, wherein a flow rate of the processing gas introduced into the processing chamber is increased during the step of forming the sheath layer and eliminating the particles from upper region of the semiconductor region.

* * * * *